United States Patent [19]

Faraone et al.

[11] Patent Number: 4,604,304

[45] Date of Patent: Aug. 5, 1986

[54] PROCESS OF PRODUCING THICK LAYERS OF SILICON DIOXIDE

[75] Inventors: Lorenzo Faraone, Montgomery Township, Somerset County; David L. Patterson, Wall Township, Monmouth County, both of N.J.

[73] Assignee: RCA Corporation, Princeton, N.J.

[21] Appl. No.: 751,680

[22] Filed: Jul. 3, 1985

[51] Int. Cl.[4] ............................................. C23C 16/40
[52] U.S. Cl. ...................................... 427/255; 427/93; 427/96; 427/255.4; 427/314; 427/315; 427/343
[58] Field of Search .................. 427/248.1, 255, 255.4, 427/255.7, 314, 315, 402, 93, 96, 99, 85, 343

[56] References Cited

U.S. PATENT DOCUMENTS

| | | | |
|---|---|---|---|
| 2,501,563 | 3/1950 | Colbert et al. | 117/107 |
| 3,158,505 | 11/1964 | Sandor | 427/255 |
| 3,892,891 | 7/1975 | Goodman et al. | 427/255 |
| 4,179,528 | 12/1979 | Losee et al. | 427/255 |
| 4,180,596 | 12/1979 | Crowder et al. | 427/255 |
| 4,268,538 | 5/1981 | Toole et al. | 427/255 |
| 4,275,094 | 6/1981 | Takagi et al. | 427/255 |
| 4,293,589 | 10/1981 | Takagi et al. | 427/255 |
| 4,293,590 | 10/1981 | Takagi et al. | 427/255 |
| 4,341,818 | 7/1982 | Adams et al. | 427/255 |
| 4,518,630 | 5/1985 | Grasser | 427/255 |

OTHER PUBLICATIONS

Bloem, "Nucleation of Silicon on Amorphous and Crystalline Substrates", 1979 pp. 41-58.

*Primary Examiner*—Sadie L. Childs
*Attorney, Agent, or Firm*—Birgit E. Morris; R. Hain Swope

[57] ABSTRACT

An improvement in the formation of thick, i.e. 1,200 nanometers and greater, layers of silicon dioxide on a substrate is provided. The silicon dioxide layer is provided by the alternate deposition and oxidation of thin layers of silicon. In comparison to conventional oxidation, the time required for formation of a thick layer of silicon dioxide in accordance with the disclosed process is substantially reduced.

8 Claims, No Drawings

PROCESS OF PRODUCING THICK LAYERS OF SILICON DIOXIDE

This invention relates to a process for the production of thick layers of silicon dioxide on a suitable substrate.

BACKGROUND OF THE INVENTION

Multilevel structures, consisting of silicon layers separated by insulating dielectrics, are extensively used in integrated circuit structures such as charged coupled devices, EEPROM devices and CMOS devices. The insulating dielectric is typically silicon dioxide which is formed by thermal oxidation of the underlying silicon surface or by chemical vapor deposition thereon. Thermally grown silicon dioxide is generally preferred because of the simplicity of the processing involved and the purity of the oxide obtained.

Certain device structures require a thick layer of insulating oxide, i.e. at least 1,200 nanometers and, in certain instances, exceeding two micrometers in thickness. For example, layers of silicon dioxide utilized to separate functional entities in a multilayer structure, are frequently well in excess of one micrometer in thickness. Certain processes such as deposited silicon recrystallization utilize as a starting substrate a silicon wafer having a thick coating of silicon dioxide on its surface. Optical gratings are formed from a sapphire substrate having a thick layer of silicon dioxide on its surface, and the like.

There are a number of disadvantages inherent in forming a thick layer of silicon dioxide by conventional deposition processes, such as sputtering or electron beam evaporation. Thick layers of silicon dioxide formed by deposition are generally characterized by a significant stress factor. Such layers also often contain voids. The stress and voids problems are conventionally alleviated by high temperature annealing of the structure which may be disadvantageous depending on its ability to withstand high temperatures. There is also the possibility that impurities from the environment may be trapped in the growing film, particularly if it is deposited by sputtering techniques.

Growing of a thick layer of silicon dioxide by thermal oxidation also has certain disadvantages. Most prominent among these is that, as the layer of oxide gets thicker, it becomes increasingly difficult for the oxygen to reach the underlying silicon and, therefore, the growth process materially slows as the layer of oxide thickens. Under ideal conditions, it may require about seven hours in a steam ambient at 950° C. as a single oxidation step to grow a layer of silicon dioxide 1,200 nanometers thick. In addition to the time and energy required, such an extended oxidation process at high temperature often causes diffusion of impurities in the substrate which can adversely affect both their profile distribution and the efficacy of their function. An extended oxidation can increase the density of oxidation-induced stacking faults which result from thermal oxidation of a silicon substrate. Experience has shown that such stacking faults become more pronounced as oxidation extends deeper into the substrate. Lastly, an extended oxidation of a silicon substrate which consumes the silicon can be disadvantageous in that, if not properly controlled, it may leave more or less than the desired thickness of a layer of silicon overlying a layer of different material, a buried device, and the like.

In accordance with this invention, a method has been found to form a thick layer of silicon dioxide by thermal oxidation of a silicon substrate which requires substantially less time than conventional thermal oxidation and which minimizes or eliminates the disadvantages associated therewith.

SUMMARY OF THE INVENTION

Layers of silicon dioxide substantially thicker than one micrometer are grown on a silicon substrate or a substrate having a layer of silicon on its surface by initially oxidizing the surface silicon to form a thin layer of silicon dioxide thereon, depositing a thin layer of silicon thereon, oxidizing the deposited silicon layer thereby increasing the thickness of the silicon dioxide layer and repeating the deposition and oxidation steps as necessary to form the desired thickness of silicon dioxide.

DETAILED DESCRIPTION OF THE INVENTION

The process of this invention is an improvement in the formation of thick layers of silicon dioxide on a substrate which may be silicon or another suitable material such as sapphire. The term "thick" as utilized herein indicates a layer of silicon dioxide in excess of one micrometer in thickness and, preferably, in excess of 1,200 nanometers in thickness. It will be appreciated that the process of this invention can be utilized to form layers of silicon dioxide less than a micrometer in thickness. There is, however, little practical advantage in doing so. The benefits of the subject process increase in relation to the desired thickness of the silicon dioxide layer to be formed. For example, at 950° C. in a steam ambient the time required to form a layer of silicon dioxide about 1,700 nanometers thick by the subject process is approximately half of that required to form the same layer under similar conditions by conventional one-step thermal oxidation. This savings in time provides a number of advantages as will be discussed hereinafter.

The substrate upon which a thick layer of silicon dioxide is formed in accordance with this invention may be any suitable material generally utilized in the electronics industry. The substrate may be a silicon wafer or another material such as sapphire, having a layer of silicon thereon. The layer of silicon may be totally consumed in forming the initial thin layer of silicon dioxide in accordance with the subject method, or may be of sufficient thickness so that, by design, a portion will remain unoxidized after the initial oxidation step. Whether a layer of silicon remains on the substrate depends on the requirements for the structure being made. The silicon layer, or the surface of a silicon substrate, may be doped in whole or in part with one or more conductivity modifiers by any conventional technique.

The incremental layers of silicon dioxide grown to form a thick layer in accordance with the present method are each from about 250 to 700, preferably from about 400 to about 600, nanometers in thickness. As is the case with the total thickness of the layer of oxide, it will be appreciated that the incremental deposits can readily be made both larger and smaller. As a practical matter, however, these thicknesses are optimum for the subject method. The number of incremental deposits contemplated herein is dependent primarily on the desired final thickness of the oxide layer, and also on other considerations such as the parameters of the oxidation process being utilized and the requirements of the substrate itself with regard to time-temperature cycling, silicon consumption and the like. At least two oxidation steps, and often three or more, are contemplated in the present method.

In a typical embodiment of the present process, a layer of silicon between about 120 and 400, preferably between about 200 and 325, nm thick is grown on a suitable substrate by low pressure chemical vapor deposition (LPCVD) at a temperature of about 580° C. or less, suitably at about 560° C. The resulting layer of amorphous silicon is then oxidized, e.g. in steam or in dry oxygen at a temperature between about 800° and 1100° C. The silicon deposition and oxidation steps are repeated twice more to grow a layer of silicon dioxide about 1,500 nm thick. Beginning with the initial deposition, approximately 450 minutes of oxidation are required to form a layer of silicon dioxide about 1,500 nm thick by the subject process. In contrast, beginning with a layer of silicon of sufficient thickness, over 800 minutes are required to conventionally produce the same thickness of silicon dioxide by a single oxidation step.

The subject process possesses a number of advantages over conventional oxidation in addition to the readily apparent savings in time and energy. For example, when a silicon substrate or layer to be oxidized contains pre-existing distributions of conductivity-modifying impurities, such as phosphorus or boron, conventional oxidation, by consuming the silicon, changes the impurity distribution. Conventional oxidation also increases the tendency for such impurities to migrate within the structure. Boron, for example, tends to migrate or segregate into the growing oxide layer, whereas phosphorus tends to migrate into the remaining silicon of the substrate or silicon layer. These effects are undesirable, both wherein the substrate has discrete impurity implants and wherein the silicon layer to be oxidized is uniformly doped with an impurity. The tendency of such impurities to migrate is enhanced with residence time in the furnace and with the amount of silicon that is consumed in order to form the thick silicon dioxide layer.

An example of the migration effect is the surface implantation of boron under a thick layer of oxide as a barrier against current flow. Over an extended residence time in the furnace, such as is required by conventional oxidation, the boron has a tendency to migrate not only into the oxide but also into the surrounding silicon. With the subject process, after the initial layer of silicon dioxide is formed, subsequent depositions of silicon and oxidation thereof are further removed from the original surface and are of shorter duration. Therefore, there is significantly less chance for oxygen to penetrate to the surface and use up additional substrate, or silicon layer, and substantially less boron migration.

Because the present process, after the initial oxidation step, does not consume the underlying silicon substrate or layer, the incidence of oxidation-induced stacking faults is minimized. These faults, which result from the interaction of the oxidation process and the silicon crystal, become more pronounced and grow in number as conventional one-step oxidation proceeds deeper into the substrate. Such faults, which are considered a major problem in silicon processing, can result in excessive junction leakage, and can roughen the surface of the oxide/silicon interface which adversely affects the integrity of a device incorporating the oxidized silicon layer.

Another advantage of the subject process is that it substantially avoids surface roughness caused by uneven oxidation of a layer of silicon heavily doped with an impurity such as phosphorus or arsenic. In such layers, the impurity ions have a tendency to collect at the grain boundaries. Because such ions, particularly phosphorus, tend to catalyze oxidation, it will take place somewhat more rapidly at the grain boundaries, thus producing an uneven surface. As geometries of semiconductor devices grow finer and the requirements for uniformity and surface smoothness of layers of material in a device become more stringent, these advantages of the subject process will become more important.

The following Examples further illustrate this invention, it being understood that the invention is in no way intended to be limited to the details described therein. In the Examples, all parts and percentages are on a weight basis and all temperatures are in degrees Celsius, unless otherwise stated.

CONTROL

A n-type <100> silicon wafer, three inches in diameter, was oxidized in a steam ambient at 950° for 800 minutes. The resulting silicon dioxide layer was 1,410 nm thick.

EXAMPLE 1

A n-type <100> silicon wafer, three inches in diameter, was oxidized in steam at 950° as in Control, but only for 150 minutes to produce a layer of silicon dioxide 493 nm thick.

A coating of amorphous silicon was deposited on the wafer by LPCVD from silane at 560° to a thickness of 278 nm. The layer was oxidized to completeness resulting in an increase in the coating silicon dioxide layer to 1,154 nm.

The wafer was then coated with a second layer of amorphous silicon 265 nm thick. The second layer of silicon was oxidized in a like manner to increase the total thickness of the resultant oxide layer to 1,776 nm.

It required only 585 minutes to produce a silicon dioxide layer with a total thickness of 1,776 nm in contrast to a conventional one-step oxidation which required 800 minutes to grow only 1,441 nm of silicon dioxide. Based on these results, the time required to produce 1,776 nm thick layer of silicon dioxide by a conventional one-step oxidation would be approximately 1,100 minutes.

These results clearly show the substantial savings in time and energy provided by the process of this invention in comparison to a conventional one-step oxidation.

We claim:

1. In a process of providing a thick layer of thermally grown silicon dioxide on a substrate having at least a sufficient thickness of silicon at the surface thereof to form the desired thickness of silicon dioxide, by oxidizing the silicon at an elevated temperature for a time sufficient to form the desired thickness of silicon dioxide, the improvement comprising oxidizing only so much of the silicon as required to form a thin layer of silicon dioxide, depositing a thin layer of silicon over the layer of silicon dioxide, completely oxidizing the silicon layer to increase the thickness of the silicon dioxide layer, and repeating the silicon deposition and oxidation steps if and as necessary to achieve a desired thickness of silicon dioxide.

2. A process in accordance with claim 1, wherein the final thickness of the layer of silicon dioxide is at least about 1,200 nm.

3. A process in accordance with claim 1, wherein the thickness of silicon dioxide provided by each oxidation step is between about 250 and 700 nanometers.

4. A process in accordance with claim 3, wherein the thickness of silicon dioxide provided by each oxidation step is between about 400 and 600 nanometers.

5. A process in accordance with claim 1, wherein said process includes at least three oxidation steps.

6. A process in accordance with claim 1, wherein the substrate has on its surface a layer of silicon of sufficient thickness so that oxidation thereof will provide a layer of silicon dioxide from about 250 to 700 nm in thickness so that said layer is totally oxidized in the first oxidation step.

7. A process in accordance with claim 1, wherein the layers of silicon are deposited in the amorphous state by low pressure chemical vapor deposition at a temperature less than about 580° C.

8. A process in accordance with claim 7, wherein the layers of silicon are deposited at about 560° C.

* * * * *